(12) United States Patent
Imai

(10) Patent No.: US 9,082,889 B2
(45) Date of Patent: Jul. 14, 2015

(54) ARRAY SUBSTRATE FOR FLAT DISPLAY DEVICE AND MANUFACTURING THE SAME

(71) Applicant: Nobuo Imai, Ishikawa-ken (JP)

(72) Inventor: Nobuo Imai, Ishikawa-ken (JP)

(73) Assignee: Japan Display Inc., Tokyo (JP)

( * ) Notice: Subject to any disclaimer, the term of this patent is extended or adjusted under 35 U.S.C. 154(b) by 199 days.

(21) Appl. No.: 13/680,411

(22) Filed: Nov. 19, 2012

(65) Prior Publication Data

US 2013/0140571 A1 Jun. 6, 2013

(30) Foreign Application Priority Data

Dec. 2, 2011 (JP) ................................ 2011-265234

(51) Int. Cl.
| | |
|---|---|
| *H01L 33/00* | (2010.01) |
| *H01L 33/08* | (2010.01) |
| *H01L 27/12* | (2006.01) |
| *G02F 1/1362* | (2006.01) |
| *H01L 27/32* | (2006.01) |

(52) U.S. Cl.
CPC ...... *H01L 33/0041* (2013.01); *G02F 1/136227* (2013.01); *H01L 27/124* (2013.01); *H01L 27/1248* (2013.01); *H01L 27/1259* (2013.01); *H01L 33/005* (2013.01); *H01L 33/08* (2013.01); *G02F 1/136259* (2013.01); *H01L 27/3258* (2013.01); *H01L 2251/568* (2013.01)

(58) Field of Classification Search
USPC ........................................................ 257/59
See application file for complete search history.

(56) References Cited

U.S. PATENT DOCUMENTS 8,199,273 B2   6/2012 Imai

FOREIGN PATENT DOCUMENTS

| JP | 64-86113 A | 3/1989 |
|---|---|---|
| JP | 2007-52128 A | 3/2007 |
| JP | 2009-58728 | 3/2009 |
| JP | 2010-66546 A | 3/2010 |
| JP | 2010-276767 | 12/2010 |

OTHER PUBLICATIONS

Office Action issued Sep. 10, 2013 in Japanese Patent Application No. 2011-265234 (submitting English translation only).

*Primary Examiner* — Mamadou Diallo

(74) *Attorney, Agent, or Firm* — Oblon, McClelland, Maier & Neustadt, L.L.P.

(57) ABSTRACT

In one embodiment, an array substrate for a flat display device includes a gate line extending in a first direction, a source line extending a in second direction orthogonally crossing the first direction. A switching element includes a semiconductor layer, a gate electrode electrically connected with the gate line, a source electrode electrically connected with the gate line in contact with the semiconductor layer and a drain electrode in contact with the semiconductor layer. An insulating film covers the source line and the switching element, and includes a contact hole exposing the drain electrode. A pixel electrode is formed on the insulating film. An insulating filling component is filled in the contact hole of the insulating film so as to be interposed between the drain electrode and the pixel electrode in a pixel in which the source line is short-circuited with the drain electrode.

6 Claims, 6 Drawing Sheets

ARRAY SUBSTRATE FOR FLAT DISPLAY DEVICE AND MANUFACTURING THE SAME

CROSS-REFERENCE TO RELATED APPLICATION

The application is based upon and claims the benefit of priority from prior Japanese Patent Application No. 2011-265234, filed Dec. 2, 2011, the entire contents of which are incorporated herein by reference.

FIELD

Embodiments described herein relate generally to an array substrate for a flat display device and manufacturing the same.

BACKGROUND

Flat display devices such as a liquid crystal display device and an organic electroluminescence display device, are used in various fields as displays for an OA equipment such as a personal computer and a television receiver, taking advantage of the features of a light weight, a thin shape, and a low power consumption. In recent years, the flat display device is used also as displays for a personal digital assistant such as a cellular phone, a car navigation equipment, and a game machine.

An array substrate applied to the flat display device is equipped with gate lines and source lines arranged so as to cross through an insulating layer, switching elements electrically connected with the gate lines and source lines, and a pixel electrode connected with the switching element. The array substrate is manufactured through formation of an insulating layer, and patterning of an electric conductive film, etc. However, in the patterning of the electric conductive film, when undesirable defective processing arises, there is a possibility of causing the fall of a manufacturing yield. For this reason, the various repair techniques are proposed to the defective processing of the electric conductive film.

BRIEF DESCRIPTION OF THE DRAWINGS

The accompanying drawings, which are incorporated in and constitute a portion of the specification, illustrate embodiments of the invention, and together with the general description given above and the detailed description of the embodiments given below, serve to explain the principles of the invention.

DETAILED DESCRIPTION

Figure 1:
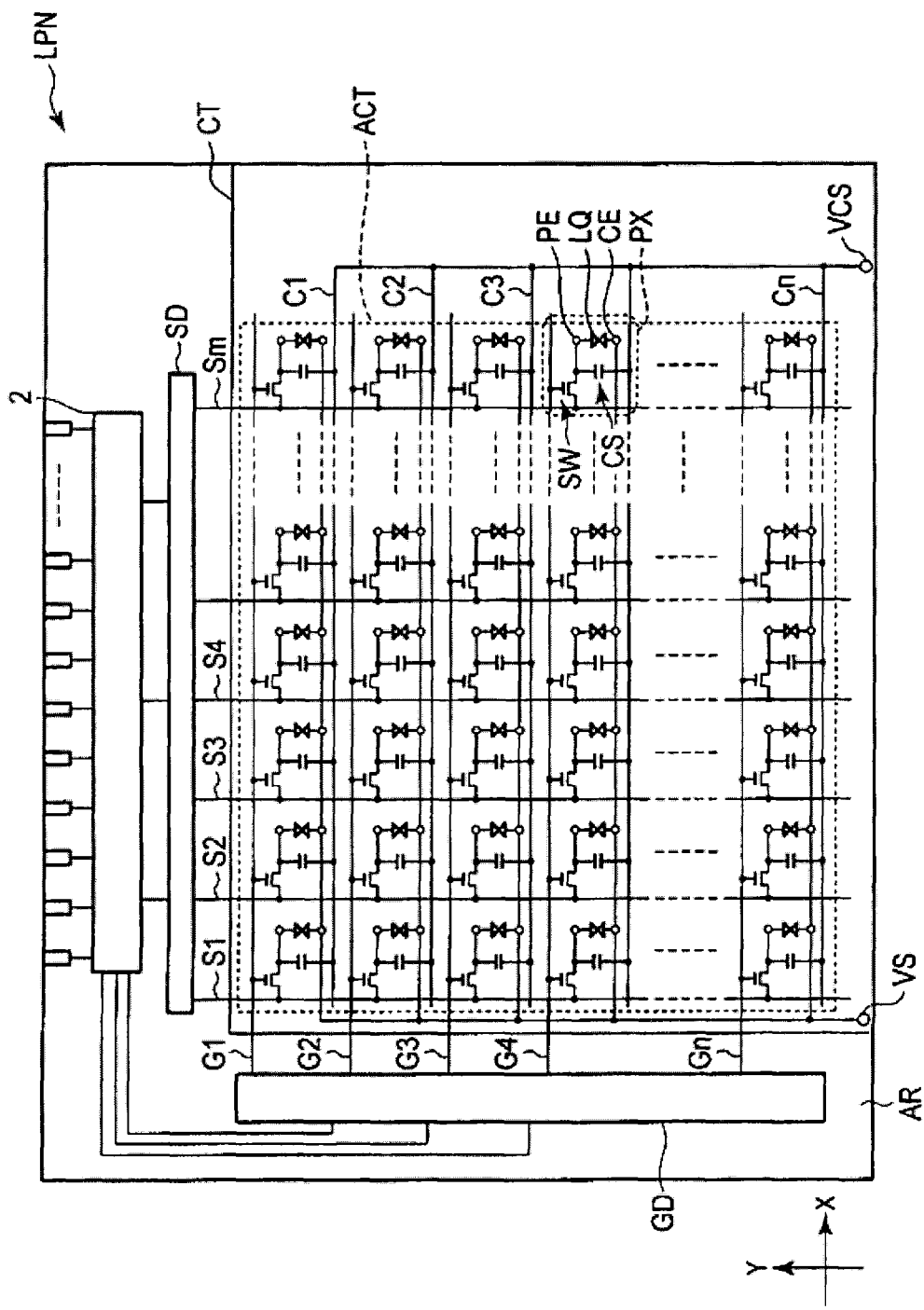
FIG. 1 is a figure schematically showing a structure and the equivalent circuit of a liquid crystal display panel which constitutes the liquid crystal display device according to the embodiment.

An array substrate for a flat display device and a method of the manufacturing the same according to an exemplary embodiment of the present invention will now be described with reference to the accompanying drawings wherein the same or like reference numerals designate the same or corresponding portions throughout the several views.

According to one embodiment, an array substrate for a flat display device having a plurality of pixels includes: a gate line extending in a first direction; a source line extending in a second direction orthogonally crossing the first direction; a switching element including a semiconductor layer, a gate electrode electrically connected with the gate line, a source electrode electrically connected with the gate line in contact with the semiconductor layer and a drain electrode in contact with the semiconductor layer; an insulating film covering the source line and the switching element, and having a contact hole exposing the drain electrode; and a pixel electrode formed on the insulating film; wherein an insulating filling component is filled in the contact hole of the insulating film so as to be interposed between the drain electrode and the pixel electrode in a pixel in which the source line is short-circuited with the drain electrode.

According to other embodiment, a method of manufacturing an array substrate for a flat display device, comprising the steps: forming a switching element including a semiconductor layer, a gate electrode electrically connected with a gate line, a source electrode electrically connected with a source line in contact with the semiconductor layer and a drain electrode in contact with the semiconductor layer on an insulating substrate; forming an insulating film covering the source line and the switching element and including a contact hole exposing the drain electrode; covering the drain electrode with an insulating filling component by filling in the contact hole in a pixel in which the source line is short-circuited with the drain electrode; and forming a pixel electrode on the filling component and the insulating film.

According to other embodiment, a method of manufacturing an array substrate for a flat display device including a plurality of pixels, comprising the steps: forming a switching element including a semiconductor layer, a gate electrode electrically connected with a gate line, a source electrode electrically connected with a source line in contact with the semiconductor layer and a drain electrode in contact with the semiconductor layer on an insulating substrate; inspecting existence of short circuit between the source line and the drain electrode of the pixel formed on the insulating substrate in which the switching element is formed; outputting a location information of the short circuit on the processed substrate when the short circuit is detected; forming an insulating film covering the source line and the switching element and including a contact hole exposing the drain electrode; forming a pixel electrode on the insulating film extending to the contact hole and contacted with the drain electrode in the pixel in which the short circuit is not detected; covering the drain electrode with an insulating filling component by filling in the contact hole in a pixel in which the short circuit is detected, and forming a pixel electrode on the filling component and the insulating film.

Although the flat display device corresponds to a liquid crystal display device, an organic electroluminescence display device, etc., according to the embodiment, hereinafter, the liquid crystal display device is explained as an example.

FIG. 1 is a figure schematically showing a structure and the equivalent circuit of a liquid crystal display panel LPN which constitutes the liquid crystal display device according to the embodiment.

The liquid crystal display device is equipped with an active-matrix type transmissive liquid crystal display panel LPN. The liquid crystal display panel LPN is equipped with an array substrate AR as a first substrate, a counter substrates CT as a second substrate arranged opposing the array substrate AR, and a liquid crystal layer held between the array substrate AR and the counter substrate CT. The liquid crystal display panel LPN includes an active area ACT which displays images. The active area ACT is constituted by a plurality of pixels PX arranged in the shape of a (m×n) matrix (here, "m" and "n" are positive integers).

The array substrate AR includes n gate lines G (G1-Gn) which extend along a first direction X in the active area ACT, respectively, and n capacitance lines C (C1-Cn), m source lines S (S1-Sm) which extend along a second direction Y that intersects perpendicularly the first direction X, respectively, a switching element SW electrically connected with the gate line G and source line S in each pixel PX, a pixel electrodes PE electrically connected to the switching element SW, and a common electrode CE, etc., facing the pixel electrode PE.

The common electrode CE is formed in common to a plurality of pixels PX. The pixel electrode PE is formed in the shape of an island in each pixel PX.

Each gate line G is pulled out to outside of the active area ACT and connected to a gate driver GD. Each source line S is pulled out to the outside of the active area ACT and connected to a source driver SD. Each capacitance line C is drawn to outside of the active area ACT and electrically connected with a voltage impressing portion VCS to which auxiliary capacitance voltage is supplied. The common electrode CE is electrically connected with electric power supply portion VS to which the common voltage is supplied. At least a portion of the gate driver GD and source driver SD is formed in the array substrate AR, for example, and is connected with a driver IC chip 2. In the illustrated example, the drive IC chip 2 as a signal source required for driving the liquid crystal display panel LPN is mounted on the array substrate AR outside of the active area ACT of the liquid crystal display panel LPN.

The liquid crystal display panel LPN of the illustrated example is applicable to the FFS mode or the IPS mode, and includes the pixel electrode PE and the common electrode CE in the array substrate AR. In the liquid crystal liquid crystal display panel LPN, the molecule which constitutes the liquid crystal layer LQ is switched mainly using horizontal electric field (for example, electric field almost in parallel to the principal surface of the substrate in the fringe electric field) formed between the pixel electrode PE and the common electrode CE.

In the embodiment, not only the IPS mode and the FFS mode, but TN (Twisted Nematic) mode, OCB (Optically Compensated Birefringence) mode, VA (Vertical Aligned) mode, etc., are applicable. In the TN mode, the OCB mode, the VA mode, etc., while the array substrate AR is equipped with the pixel electrode PE, the counter substrate CT is equipped with the common electrode CE.

Figure 2:
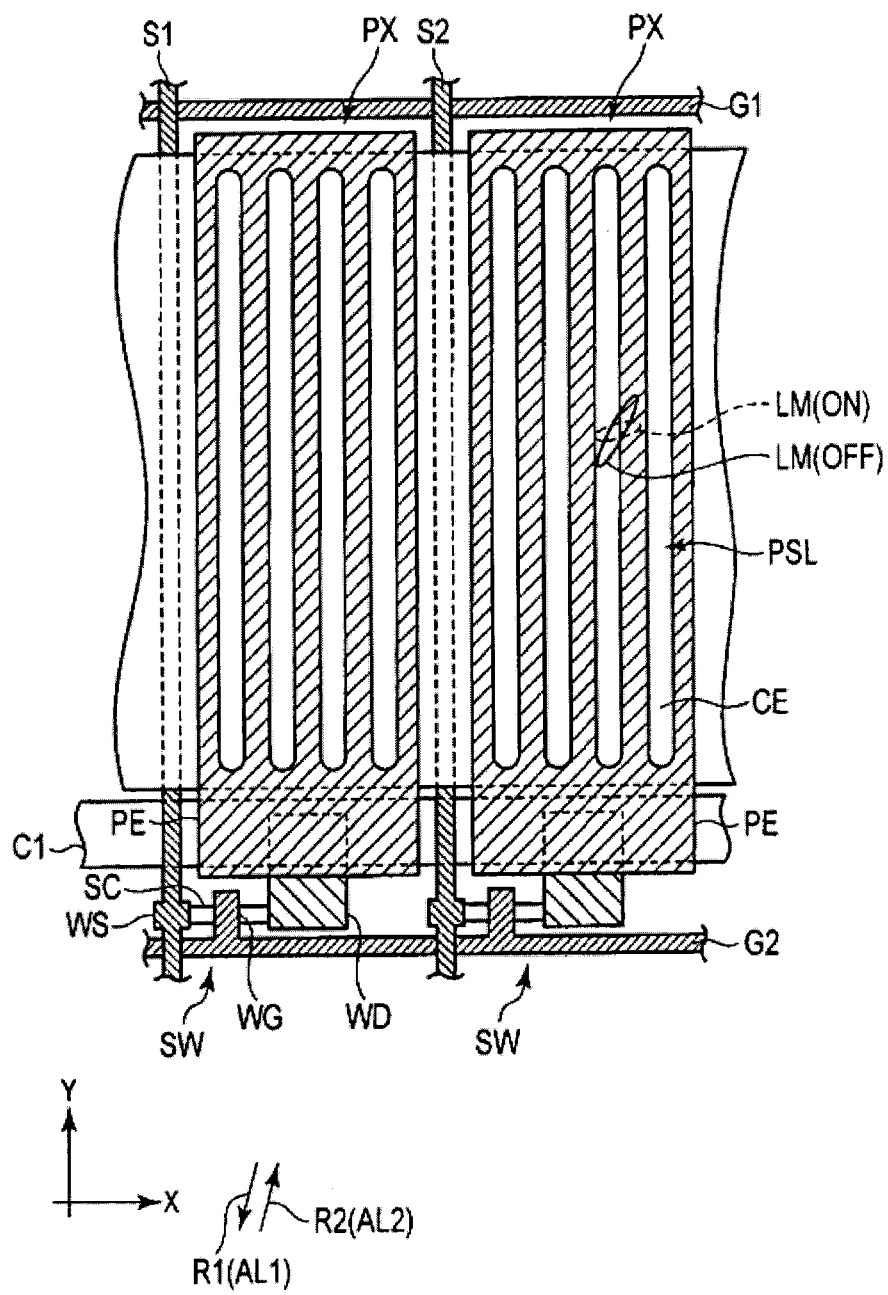
FIG. 2 is a schematic plan view of a pixel in an array substrate shown in FIG. 1 seen from a counter substrate side.

FIG. 2 is a schematic plan view of a pixel in the array substrate shown in FIG. 1 seen from the counter substrate side. In addition, only the principal portion required for explanation is illustrated here.

The gate lines G1 and G2 extend along the first direction X, respectively. The gate lines G1 and G2 are arranged with a first pitch along the second direction Y. Between the gate line G1 and the gate line G2, the capacitance line C1 extends along the first direction X. The source lines S1 and S2 extend along the second direction Y, respectively. The source lines S1 and S2 are arranged with a second pitch along the first direction X smaller than the first pitch. The pixel PX formed with the gate lines G1 and G2 and the source lines S1 and S2 has a rectangle shape whose length in the first direction X is shorter than the length in the second direction Y. That is, the length in the second direction Y of the pixel PX corresponds to the first pitch between the gate lines, and the length in the first direction X of the pixel PX corresponds to the second pitch between the source lines.

In the pixel PX on the left-hand side in the figure, the switching element SW is arranged near an intersection portion of the gate line G2 and the source line S1, and is electrically connected with the gate line G2 and the source line S1. The switching element SW is formed of a thin film transistor (TFT), for example. The switching element SW is equipped with a semiconductor layer SC formed of poly-silicon or amorphous silicon. In addition, although the switching elements SW may be any of a top-gated type and a bottom-gated type, the top-gated type is used in the illustrated example.

The switching element SW is equipped with a gate electrode WG electrically connected with the gate line G2, a source electrode WS electrically connected with the source line S1 and contacted with the semiconductor layer SC, and a drain electrode WD in contact with the semiconductor layer SC. In addition, in the illustrated example, the gate electrode WG is formed integrally with the gate line G2, and the source electrode WS is formed integrally with the source line S1.

The common electrode CE extends in the first direction X. That is, while the common electrode CE is formed in each pixel PX, the common electrode CE is arranged in common striding over the source lines S and facing a plurality of pixels PX which adjoin in the first direction X.

The pixel electrode PE of each pixel PX is arranged above the common electrode CE. Each pixel electrode PE is formed in the shape of an island corresponding to a rectangular pixel form in each pixel PX. In the illustrated example, the pixel electrode PE is formed substantially in the shape of the rectangle which has a short side in the first direction X, and a long side in the second direction Y. Each pixel electrode PE is electrically connected with the drain electrode WD of the switching element SW.

Moreover, a plurality of slits PSL which faces the common electrode CE is formed in each pixel electrode PE. In the illustrated example, each of the slits PSL extends along the second direction Y, and has a long axis in parallel to the second direction Y. If its attention is paid to the positional relationship between the pixel electrode PE and the source lines S1 and S2, any of the slits PSL of the pixel electrode PE are located between the source line S1 and the source line S2. Moreover, any slits PSL are also located above the common electrode CE.

Figure 3:
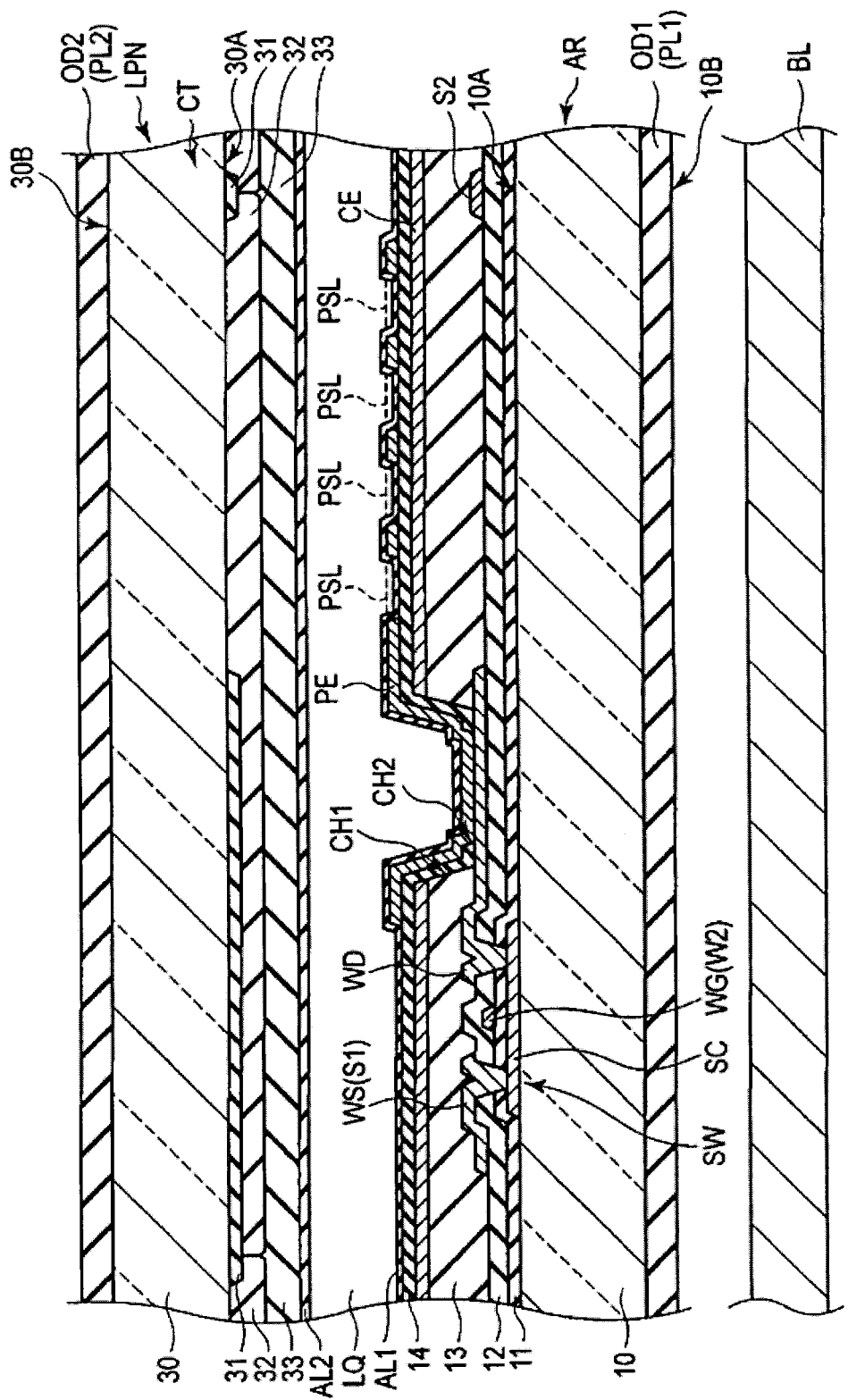
FIG. 3 is a figure schematically showing a cross-sectional structure of the liquid crystal display panel shown in FIG. 1.

FIG. 3 is a figure schematically showing a cross-sectional structure of the liquid crystal display panel LPN shown in FIG. 1. In addition, only the principal portion required for explanation is illustrated, moreover, a cross-sectional structure which is a normal pixel in which the source line and the drain electrode are not short-circuited is illustrated here.

That is, the array substrate AR is formed using a first insulating substrate 10 such as a glass substrate, etc., which has light transmissive characteristics. The array substrate AR is equipped with the switching element SW, the common electrode CE, the pixel electrode PE, etc., on an inner surface 10A (namely, the side countering the counter substrate CT) of the first insulating substrate 10.

The semiconductor layer SC of the switching element SW is arranged on the first insulating substrate 10. The semiconductor layer SC is formed with poly-silicon, for example. In addition, an undercoat layer which consists of an insulating film may be arranged between the first insulating substrate 10 and the semiconductor layer SC. The semiconductor layer SC is covered with a first insulating film 11. Moreover, the first insulating film 11 is arranged also on the first insulating substrate 10.

The gate electrode WG of the switching element SW is formed on the first insulating film 11, and is located above the semiconductor layer SC. The gate electrode WG is formed integrally with the gate line W2, and is covered with a second insulating film 12. Moreover, the second insulating film 12 is arranged also on the first insulating film 11.

The source electrode WS and the drain electrode WD of the switching element SW are formed on the second insulating film 12. Moreover, the source lines S1 and S2 are similarly formed on the second insulating film 12. The source electrode WS is formed integrally with the source line S1. The source electrode WS and the drain electrode WD are in contact with the semiconductor layer SC through a contact hole which penetrates the first insulating film 11 and the second insulating film 12, respectively. The switching element SW is covered with a third insulating film 13 with the source lines S1 and S2. The third insulating film 13 is arranged also on the second insulating film 12. A first contact hole CH1 which penetrates to the drain electrode WD is formed in the third insulating film 13. The third insulating film 13 functions as a first interlayer insulating film that covers the switching element SW. In addition, the third insulating film 13 is formed of transparent resin material, for example.

The common electrode CE is formed on the third insulating film 13. In addition, the common electrode CE does not extend to the first contact hole CH1 formed in the third insulating film 13. The common electrode CE is formed by transparent electric conductive materials such as Indium Tin Oxide (ITO) and Indium Zinc Oxide (IZO). A fourth insulating film 14 is arranged on the common electrode CE. Moreover, the fourth insulating film 14 is arranged also on the third insulating film 13. That is, the common electrode CE is located between the third insulating film 13 and the fourth insulating film 14.

The fourth insulating film 14 covers a portion of the first contact hole CH1. In the portion of the fourth insulating film 14 which covers the first contact hole CH1, a second contact hole CH2 which penetrates to the drain electrode WD is formed. Thereby, a portion of the drain electrode WD is exposed from the third insulating film 13 and the fourth insulating film 14. The fourth insulating film 14 functions as a second interlayer insulating film. In addition, the fourth insulating film 14 is formed with silicon nitride (SiNx), for example.

The pixel electrode PE is formed on the fourth insulating film 14, and faces the common electrode CE. The pixel electrode PE is electrically connected with the drain electrode WD of the switching element SW through the first contact hole CH1 penetrating in the third insulating film 13 and the second contact hole CH2 penetrating in the fourth insulating film 14. Moreover, the slits PSL are formed in the pixel electrode PE. The pixel electrode PE is formed by transparent electric conductive materials, such as ITO and IZO.

The pixel electrode PE is covered with a first alignment film AL1. Moreover, the first alignment film AL1 also covers the fourth insulating film 14. The first alignment film AL1 is formed of a material which shows a horizontal alignment characteristics, and is arranged on the surface of the array substrate AR which touches the liquid crystal layer LQ.

On the other hand, the counter substrate CT is formed using a second insulating substrate 30 such as a glass substrate, which has light transmissive characteristics. The counter substrate CT is equipped with a black matrix 31, a color filter 32, an overcoat layer 33, etc., which define each pixel PX in the inside 30A (namely, the side countering the array substrate AR) of the second insulating substrate 30.

In the inside 30A of the second insulating substrate 30, the black matrix 31 is formed so that the black matrix 31 counters with line portions such as the gate line G, the source line S, and the switching element SW arranged in array substrate AR.

The color filter 32 is formed in the inside 30A of the second insulating substrate 30 and extends also on the black matrix 31. The color filter 32 is formed of resin material colored in several mutually different colors, for example, red, green and blue, i.e., the three primary colors, respectively. The boundaries between the color filters 32 of the different colors are located on the black matrix 31.

The overcoat layer 33 covers the color filter 32. The overcoat layer 33 makes flat unevenness of the surface of the black matrix 31 or the color filter 32. The overcoat layer 33 is formed of the transparent resin material. Moreover, the overcoat layer 33 is covered with a second alignment film AL2. The second alignment film AL2 is formed of the material which shows a horizontal alignment characteristics, and is arranged on the surface of the counter substrate CT which touches the liquid crystal layer LQ.

The array substrate AR and the counter substrate CT mentioned above are arranged so that the first alignment film AL1 and the second alignment film AL2 face each other. At this time, a predetermined cell gap is formed by a pillar-shaped spacer formed integrally with one of the substrates between the array substrate AR and the counter substrate CT. The array substrate AR and the counter substrate CT are pasted together by seal material while the cell gap is formed. The liquid crystal layer LQ is constituted by the liquid crystal composite containing the liquid crystal molecule LM injected in the cell gap formed between the first alignment film AM of the array substrate AR and a second alignment film AL2 of the counter substrate CT.

A backlight 4 is arranged on the back side of the array substrate AR in the illustrated example. Various types of backlights 4 can be used. For example, a light emitting diode (LED) or a cold cathode fluorescent lamp (CCFL), etc., can be applied as a light source of the backlight 4, and the explanation about its detailed structure is omitted.

A first optical element OD1 containing a first polarizing plate PL1 is arranged on an external surface 10B of the array substrate AR, i.e., the external surface of the first insulating substrate 10. Moreover, a second optical element OD2 containing a second polarizing plate PL2 is arranged on an external surface 30B of the counter substrate CT, i.e., the external surface of the second insulating substrate 30. The first polarization axis (or first absorption axis) of the first polarizing plate PL1 and the second polarization axis (or second absorption axis) of the second polarizing plate PL2 are arranged in Cross-Nicol positional relationship, for example.

As shown in FIG. 2, alignment treatment (for example, rubbing processing and optical alignment processing) of the first alignment film AL1 and the second alignment film AL2 is mutually carried out in a surface in parallel with the substrate surface (or X-Y plane). The alignment treatment of the first alignment film AM is carried out along a direction which intersects with an acute angle of 45° or less with respect to the long axis of the slit PSL (the second direction Y in the example shown in FIG. 2). The alignment treatment direction R1 of the first alignment film AL1 is a direction crossing the second direction Y in which the slit PSL extends, with an angle of 5°-15°, for example. Moreover, the alignment treatment of the second alignment film AL2 is carried out along the direction in parallel to the alignment treatment direction R1 of the first alignment film AL1. The alignment treatment direction R1 of the first alignment film AL1 and the alignment treatment direction R2 of the second alignment film AL2 are opposite, mutually.

In addition, at this time, the first polarization axis of the first polarizing plate PL1 is set to a direction in parallel to the alignment treatment direction R1 of the first alignment film AL1, for example, and the second polarization axis of the second polarizing plate PL2 is set to a direction which intersects perpendicularly with the alignment treatment direction R1 of the first alignment film AL1.

Especially, the array substrate AR in the above liquid crystal display device is manufactured as follows.

Figure 4:
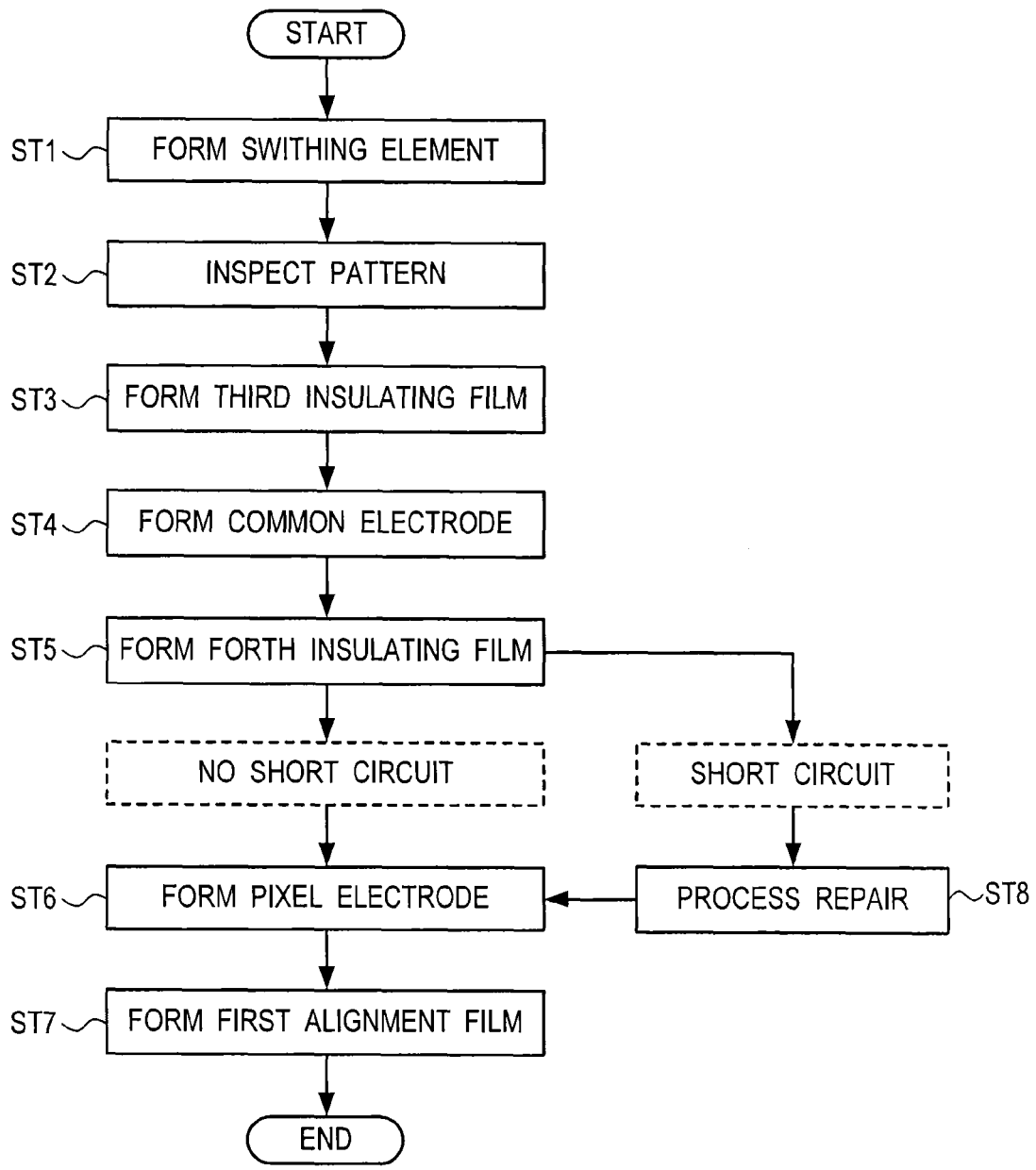
FIG. 4 is a flow chart schematically showing a manufacturing process of the array substrate shown in FIG. 3.

FIG. 4 is a flow chart schematically showing the manufacturing process of the array substrate AR shown in FIG. 3.

First, the switching element SW is formed on the first insulating substrate 10 (ST1). In the process in which the switching element SW is formed, the semiconductor layer SC patterned in the island shape, the first insulating film 11, the gate line G, the gate electrode WG and the second insulating film 12 are formed sequentially. After that, a source metal layer is formed on the second insulating film 12, then the source metal is patterned through a photolithography process, etc., and the source line S, the source electrode WS, and the drain electrode WD are formed simultaneously.

Then, the processed substrate in which the switching element SW was formed is introduced into an inspection equipment, and the formed pattern is inspected (ST2). Especially, in the pattern inspection here, the pattern of the source line S, the source electrode WS and the drain electrode WD formed by patterning of the source metal layer are inspected, and existence of a short circuit between the drain electrode WD and the source line S is inspected. At this time, the drain electrode WD is separated from the source line S in the normal switching element SW. On the other hand, when the source metal layer cannot be patterned correctly but an extraneous pattern of the source metal occurs, the drain electrode WD and source line S may be connected. Thus, if the drain electrode WD and the source line S are short-circuited, the switching element SW does not operate normally. That is, the short circuit results in a state where the voltage of the source line S is always impressed to the pixel electrode PE connected to the switching element SW at the next process.

In the pattern inspection, when the short circuit between the drain electrode WD and the source line S is detected, the inspection equipment generates a short circuit location information on the processed substrate which is the subject substrate to be inspected. The location information also includes an identification information of the processed substrate in which the short circuit is detected other than a coordinate information on the short circuit position (for example, X coordinate in the first direction X and Y coordinate in the second direction X on the first insulating substrate 10). For this reason, while being able to specify the processed substrate in which the short circuit was detected by referring to the generated location information, it becomes possible to specify the position (coordinates in the processed substrate) in which the short circuit is produced in the processed substrate. Thus, the short circuit location information generated with the inspection equipment is outputted to a management server of a higher rank rather than the inspection equipment. The management server manages varieties of information produced in the manufacturing process of the array substrate, such as a defect information and a repair information.

Then, the third insulating film 13 is formed on the processed substrate which is judged that the defect was not detected, and that the repair is possible even if the defect of the processed substrate was detected through the pattern inspection (ST3). In the formation process of the third insulating film 13, the first contact hole CH1 which exposes the drain electrode WD is formed.

Successively, the common electrode CE is formed on the third insulating film 13 (ST4), and the fourth insulating film 14 is further formed on the common electrode CE (ST5). In the formation process of the fourth insulating film 14, the second contact hole CH2 which exposes the drain electrode WD is formed.

Then, in the processed substrate in which the short circuit was not detected by the pattern inspection, the pixel electrode PE having the slits PSL is formed on the fourth insulating film 14 (ST6). The pixel electrode PE extends not only on the fourth insulating film 14 but to the first contact hole CH1 and the second contact hole CH2, and contacts with the drain electrode WD exposed by the contact holes. The array substrate AR is completed by forming the first alignment film AL1 on the processed substrate in which the pixel electrode PE was formed (ST7).

On the other hand, in the processed substrate in which the short circuit was detected by the pattern inspection, the processed substrate is introduced into the repair equipment and repaired (ST8). That is, in the pixel PX in which the drain electrode WD and the source line S are short-circuited, the first contact hole CH1 and the second contact hole CH2 are filled up with an insulating filling component based on the location information outputted from the inspection equipment, and the drain electrode WD is covered by the insulating material. That is, the first contact hole CH1 and the second contact hole CH2 are covered by the filling component.

After that, in the processed substrate in which the repair processing is performed, the pixel electrode PE is formed on the fourth insulating film 14 like the processed substrate in which the short circuit was not detected (ST6). Then the first alignment film AL1 is formed (ST7). Though the formed pixel electrode extends not only on the fourth insulating film 14 but to the positions in which the first contact hole CH1 and the second contact hole CH2 are formed, the filling component is interposed between the pixel electrode PE and the drain electrode WD in the contact holes. That is, the pixel electrode PE does not contact with the drain electrode WD, and is not electrically connected with the switching element SW provided with the drain electrode WD shorted with the source line S. Therefore, voltage is not impressed to the pixel electrode PE formed in this way.

Figure 5:
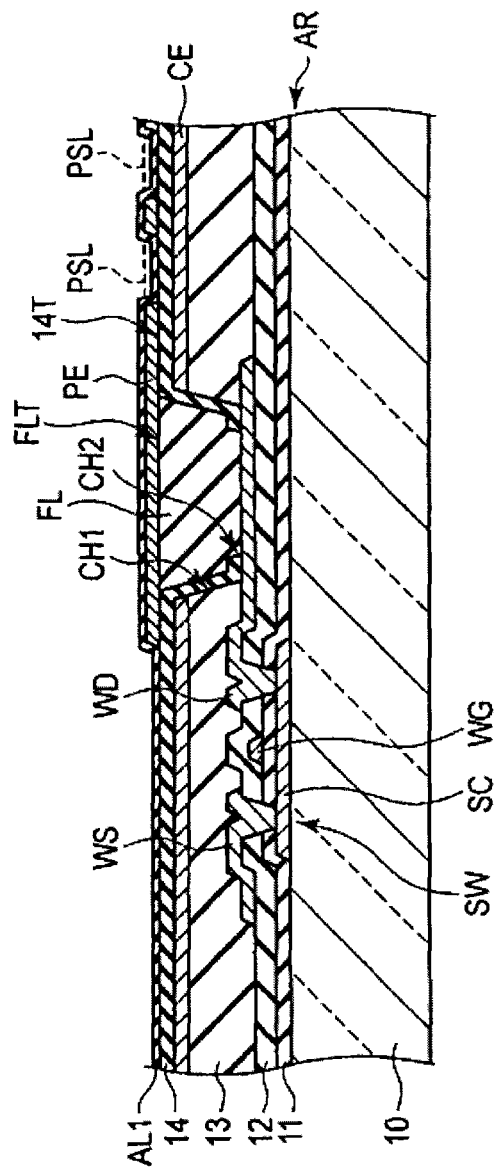
FIG. 5 is a figure schematically showing a cross-sectional structure of the array substrate which received a repair processing.

FIG. 5 is a figure schematically showing a cross-sectional structure of the array substrate AR in which the repair processing is performed.

The position in which the first contact hole CH1 and the second contact hole CH2 are formed is filled up with the filling component FL. The filling component FL is formed of an insulating resin material, for example. In the illustrated example, although the upper surface FLT of the filling component FL is made flat and forms the same plane as the upper surface 14T of the fourth insulating film 14, the upper surface FLT may rise in the shape of a dome toward above rather than the upper surface 14T, or may become depressed in the shape of a ball toward under rather than the upper surface 14T. Anyway, the filling component FL is formed so that the drain electrode WD is covered without any clearance.

The filling component FL in the above shape is formed by coating a liquid resin material, and covering the drain electrode WD in a recess wall formed of the first contact hole CH1 and the second contact hole CH2, for example so as to fill the recess. The resin material is cured in the state where the resin material in the whole circumference of the recess wall blends in with the fourth insulating film 14.

At this time, in case the coated amount of the resin material is substantially the same as the capacity of the recess, the upper surface of the filing component FL is flattened. On the other hand, when the amount of application of the resin material is larger than the capacity of the recess, the upper surface FLT of the filling component FL rises. When the amount of application of the resin material is smaller than the capacity of the recess, the upper surface FLT of the filling component FL becomes depressed.

Next, the repair processing by the repair equipment is explained more concretely.

Figure 6:
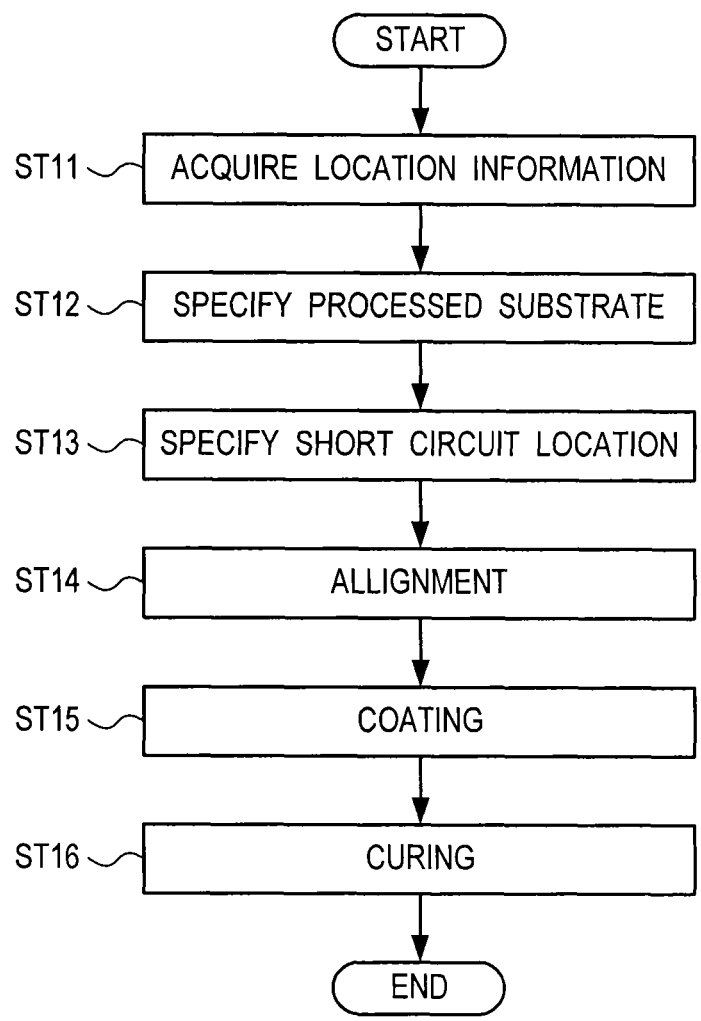
FIG. 6 is a flow chart schematically showing the repair processing in the manufacturing process of the array substrate shown in FIG. 3.

FIG. 6 is a flow chart schematically showing the repair processing in the manufacturing process of the array substrate AR shown in FIG. 3.

First, the repair equipment acquires the location information generated with the inspection equipment or the location information managed with the management server (ST11). Then, the identification information of the introduced processed substrate and the identification information on the processed substrate contained in the acquired location information are checked, and the processed substrate to be repaired is specified (ST12). Then, the short circuit position, i.e., the coordinates in the processed substrate is specified based on the coordinate information included in the acquired location information, (ST13). Subsequently, positional alignment of the processed substrate is performed based on the specified coordinates (ST14).

Furthermore, in the pixel in which the short circuit is detected, the repair equipment applies the liquid resin material toward the location (repair location) in which the first contact hole CH1 and the second contact hole CH2 are formed (ST15). A micro dispenser, etc., are applicable to fill the resin material in the recess, for example. Then, the resin material is cured by irradiating light (ST16). Thus, the filling up of the filling component FL is performed.

Hereinafter, the operation in the liquid crystal display device according to the above-mentioned structure is explained.

At the time of OFF when voltage which forms the potential difference between the pixel electrode PE and the common electrode CE is not impressed, it is in the state where voltage is not impressed to the liquid crystal layer LQ, and electric field is not formed between the pixel electrode PE and the common electrode CE. For this reason, the liquid crystal molecule LM contained in the liquid crystal layer LQ is initially aligned in the alignment direction of the first alignment film AL1 and the second alignment film AL2 (R1 and R2) in the X-Y plane as shown in a solid line in FIG. 2. The direction in which the liquid crystal molecule LM initially aligns is called an initial alignment direction.

At the time of OFF, a portion of the backlight from the back light BL penetrates the first polarizing plate PL1, and enters into the liquid crystal display panel LPN. The light which entered into the liquid crystal display panel LPN is a linearly polarized light which intersects perpendicularly with the first polarization axis of the first polarizing plate PL1. The polarization state of the linearly polarized light hardly changes when the light passes the liquid crystal display panel LPN at the time of OFF. For this reason, the linearly polarized light which penetrated the liquid crystal display panel LPN is absorbed by the second polarizing plate PL2 which is arranged in Cross Nicol positional relationship with the first polarizing plate PL1 (black display).

On the other hand, at the time of ON when voltage which forms potential difference between the pixel electrode PE and the common electrode CE is impressed, it is in the state where voltage is impressed to the liquid crystal layer LQ, and fringe electric field is formed between the pixel electrode PE and the common electrode CE. For this reason, the liquid crystal molecule LM is aligned in a different direction from the initial direction in the X-Y plane as shown in a dashed line in FIG. 2. In a positive type liquid crystal material, the liquid crystal molecule LM is aligned in parallel with the electric field i.e., the direction orthogonally crossing the long axis of the slit PSL.

At the time of such ON, the linearly polarized light which intersects perpendicularly with the first polarization axis of the first polarizing plate PL1 enters into the liquid crystal display panel LPN, and the polarized state changes according to the alignment state of the liquid crystal molecule LM when the light passes the liquid crystal layer LQ. For this reason, at the time of ON, at least a portion of the light which passed the liquid crystal layer LQ penetrates the second polarizing plate PL2 (white display).

In the normally black structure, in the manufacturing process of the array substrate AR, when the defect of the switching element SW is generated, i.e., when the drain electrode WD is short-circuited with the source line S occurs, even if it is at the time OFF, it becomes the state where the source voltage is impressed to the pixel electrode PE. For this reason, a light spot defect is generated in which the white is displayed in the pixel though the black should be displayed normally.

According to this embodiment, it becomes possible to detect the defect of the switching element SW by conducting the pattern inspection of the switching element SW during a period between the forming of the above-mentioned switching element SW and the forming of the pixel electrode PE, i.e., before electrically connecting with the pixel electrode PE. Then, the filling component FL is filled in the contact hole of the defective switching element SW. The drain electrode WD to which the pixel electrode PE is electrically connected is covered with the filling component FL. Thereby, the pixel electrode PE is not electrically connected with the switching element SW because the insulating filing component FL is interposed between the drain electrode WD and the pixel electrode PX. Accordingly, in the defective switching element, the potential is not applied to the pixel electrode PE any time, and black is displayed at the time OFF. That is, it becomes possible to make non-operable the pixel in which the switching element SW is defective. According to the above repair method, it becomes possible to cure the defective switching element SW and to suppress the reduction in the manufacturing yield.

In the repair method according to this embodiment, it becomes possible to reduce the damage to other layers constituting the array substrate AR comparing with a repair method in which the pixel electrode PE is cut by laser irradiation and is electrically separated from the switching element SW. Especially, the above repair method is effective in case wiring layers are arranged close each other, layers which are hard to be cut are arranged, and layers which influence to other pixels by cutting are arranged, in a circumference where the switching element SW is connected with the pixel electrode PE.

Although the above example are explained about the liquid crystal display device as a flat display, the above repair technique is applicable to other flat display devices which use the array substrate AR equipped with the similar switching element SW and the pixel electrode PE.

Moreover, although the embodiments are explained about the liquid crystal display device in the FFS mode, it is possible to improve the defective display in other display modes by filling up the insulating filling component FL in the contact hole. The insulating filling component FL disconnects between the switching element SW and the pixel electrode PE when the similar defect of the switching element SW is generated.

Especially, in the liquid crystal display device in the FFS mode, the fourth insulating film 14 of comparatively thin film thickness is interposed between the common electrode CE and the pixel electrode PE. It is indispensable for the common electrode CE and the pixel electrode PE to be electrically isolated. However, when it is tried to cut the pixel electrode PE by laser irradiation, there is a possibility that not only the pixel electrode PE but the fourth insulating film 14 may be broken through, and the common electrode CE of the lower layer and the pixel electrode PE may be short-circuited under the influence of the variation of the laser output, etc. However, in the liquid crystal display device in the FFS mode, it becomes possible to control the generation of the short circuit between the common electrode CE and the pixel electrode PE by applying the above repair method according to the embodiment.

In the above embodiment, the explanation is made about the case in which the source line S is short-circuited with the pixel electrode PE. However, the embodiment is applicable to other defects of the pixel PX. In such a case, the contact hole to connect the drain electrode WD and the pixel electrode PE is filled with the filling component FL. Thereby, the pixel PX is made in the OFF state any time. That is, the pixel does not work to display any time.

As explained above, according to the embodiment, the array substrate for the flat display device and a method of manufacturing the same can be offered, in which the fall of the manufacturing yield can be controlled by the above repair method with the small damage.

For example, in the above-mentioned embodiments, though the slit PSL of the pixel electrode PE is formed so that the slit SL has a long axis in parallel to the second direction Y, the slit SL may be formed so that the slit SL has the long axis in parallel to the first direction X. Further, the slit PSL of the pixel electrode PE may be formed so that the slit PSL has the long axis in parallel to a direction which crosses the first direction X and the second direction Y, respectively, and may be formed in a crooked shape.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An array substrate for a flat display device having a plurality of pixels, comprising:
   a gate line extending in a first direction;
   a source line extending in a second direction orthogonally crossing the first direction;
   a switching element including a semiconductor layer, a gate electrode electrically connected with the gate line, a source electrode electrically connected with the gate line in contact with the semiconductor layer and a drain electrode in contact with the semiconductor layer;
   an insulating film covering the source line and the switching element, and having a contact hole exposing the drain electrode; and
   a pixel electrode formed on the insulating film; wherein
   an insulating filling component is filled in the contact hole of the insulating film so as to be interposed between the drain electrode and the pixel electrode in a pixel in which the source line is short-circuited with the drain electrode,
   the insulating film includes a first interlayer insulating film arranged on the switching element and a second interlayer insulating film arranged above the first interlayer insulating film,
   a common electrode is arranged between the first interlayer insulating film and the second interlayer insulating film in common to the plurality of pixels, and
   a slit is formed in the pixel electrode of each pixel formed on the second interlayer insulating film so as to face the common electrode.

2. The array substrate for a flat display device according to claim 1, wherein the filling component is formed of resin material.

3. The array substrate for a flat display device according to claim 1, wherein the flat display device is formed so as to be driven in an FFS mode or an IPS mode.

4. An array substrate for a flat display device having a plurality of pixels, comprising:
   a gate line extending in a first direction;
   a source line extending in a second direction orthogonally crossing the first direction;
   a switching element including a semiconductor layer, a gate electrode electrically connected with the gate line, a source electrode electrically connected with the gate line in contact with the semiconductor layer and a drain electrode in contact with the semiconductor layer;
   an insulating film covering the source line and the switching element, and having a contact hole exposing the drain electrode; and
   a pixel electrode formed on the insulating film; wherein
   an insulating filling component is filled in the contact hole of the insulating film so as to be interposed between the drain electrode and the pixel electrode in a pixel in which the pixel is defective and the pixel does not normally operate,
   the insulating film includes a first interlayer insulating film arranged on the switching element and a second interlayer insulating film arranged above the first interlayer insulating film,
   a common electrode is arranged between the first interlayer insulating film and the second interlayer insulating film, and formed in common to the plurality of pixels, and
   a slit is formed in the pixel electrode of each pixel formed on the second interlayer insulating film so as to face the common electrode.

5. The array substrate for a flat display device according to claim 4, wherein the filling component is formed of resin material.

6. The array substrate for a flat display device according to claim 4, wherein the flat display device is formed so as to be driven in an FFS mode or an IPS mode.

* * * * *